United States Patent [19]
Yanka et al.

[11] Patent Number: 5,512,750
[45] Date of Patent: Apr. 30, 1996

[54] A-DUAL BAND IR SENSOR HAVING TWO MONOLITHICALLY INTEGRATED STARING DETECTOR ARRAYS FOR SIMULTANEOUS, COINCIDENT IMAGE READOUT

[75] Inventors: Robert W. Yanka; Milton L. Noble, both of Liverpool, N.Y.

[73] Assignee: Martin Marietta Corporation, Syracuse, N.Y.

[21] Appl. No.: 253,716

[22] Filed: Jun. 3, 1994

[51] Int. Cl.$^6$ .................. H01L 25/065; H01L 27/146; H01L 31/0296; G01J 5/22
[52] U.S. Cl. ............... 250/338.4; 250/332; 250/339.02; 250/370.08; 250/370.14
[58] Field of Search .............................. 250/332, 338.4, 250/339.02, 370.08, 370.14

[56] References Cited

U.S. PATENT DOCUMENTS

| | | | |
|---|---|---|---|
| 4,939,369 | 7/1990 | Elabd | 250/332 |
| 5,036,203 | 7/1991 | Solomon | 250/370.06 |

FOREIGN PATENT DOCUMENTS

| | | | |
|---|---|---|---|
| 3-150487 | 6/1991 | Japan | 250/370.08 |

*Primary Examiner*—Constantine Hannaher
*Attorney, Agent, or Firm*—Paul Checkovich; Stephen A. Young

[57] ABSTRACT

A compact dual band IR focal plane assembly provides simultaneous, coincident two-dimensional image readout. It includes a MIS-CID MWIR detector array formed in an epitaxial layer grown by the MBE process on the (111B) front face of an IR transparent crystalline first substrate, the pixels thereof forming LWIR transparent windows, with opaque connections thereto lying in aisles framing the windows, and a PV diode LWIR detector array formed in an epitaxial layer grown by the LPE process on the (111A) back face of the substrate, the LWIR pixels being aligned with the transparent MWIR pixels. An MWIR MUX is provided on an IR transparent silicon second substrate arranged in front of the first substrate. The opaque switch portion of the MWIR MUX is arrayed with apertures and aisles in alignment with the windows and aisles of the MIS-CID array. An LWIR MUX is provided on a third substrate bonded to the LWIR detector array beyond the image paths, the MWIR and LWIR MUXes providing simultaneous, coincident image readout.

10 Claims, 5 Drawing Sheets

FIG.6A  φ_G  ⎯⎯ ROW SCANNER DRIVE PULSE
FIG.6B  φ_R  ⎯⎯ RESET PULSE
FIG.6C  S_1  ⎯⎯ FIRST CDS SAMPLE
FIG.6D  φ_1  ⎯⎯ INJECT PULSE
FIG.6E  S_2  ⎯⎯ SECOND CDS SAMPLE
FIG.6F  Q_1  ⎯⎯ SELECT ROW 1 ⎫
FIG.6G  Q_2  ⎯⎯ SELECT ROW 2 ⎬ COUPLE TO PREAMP
FIG.6H  Q_3  ⎯⎯ SELECT ROW 3 ⎭

A-DUAL BAND IR SENSOR HAVING TWO MONOLITHICALLY INTEGRATED STARING DETECTOR ARRAYS FOR SIMULTANEOUS, COINCIDENT IMAGE READOUT

RELATED APPLICATIONS

The present application is related to the application entitled "A Dual-Band IR Scanning Focal Plane Assembly Having Two Monolithically Integrated Linear Detector Arrays", filed concurrently by the inventors of the present application, and assigned to the assignee of the present application and having Ser. No. 08/253,847.

BACKGROUND OF THE INVENTION

1. Field of the Invention

The invention relates to staring IR detector arrays in which two two-dimensional images of an object field are simultaneously readout, and more particularly to one in which medium wave IR (MWIR) and long wave IR (LWIR) detector area arrays are registered, pixel for pixel, for image coincidence.

2. Prior Art

A staring two dimensional focal plane configuration for IR detection that is capable of simultaneous, superimposed, dual band MWIR and LWIR pixel-registered, image readout is known. The advantage of a dual band focal plane array (FPA) of this kind is that it leads to a compact design for the IR sensor requiring only a single optical image input and not requiring optical beam splitters, electrical or optical switches, or other means to superimpose the images upon spatially separated arrays. The dual band design ideally provides continuous, staring, simultaneous, and precisely registered image-sensing in both spectral bands.

Available technology-has provided such compact dual band, focal planes with scanned linear detector arrays, but not with staring two-dimensional (area) arrays. With the simpler scanned linear arrays it is possible to superimpose a MWIR detector array with its associated readout multiplexing circuitry or "MUX" over a LWIR detector array and its "MUX", with the detector arrays in the focused optical beam and the optically opaque multiplexers displaced to one side of the focused optical beam.

The widest dynamic range, most sensitive IR detector arrays are photovoltaic (PV) diodes, which require a one-to-one connection between each detector pixel and a preamplifier dedicated to each pixel as a necessary part of the MUX. Since the multiplexer integrated circuit chips are not IR transmissive due to diffusion wells, circuit runs and other active silicon CMOS circuitry, it is not possible to transfer images through the PV diode MUX assuming pixels arranged in two dimensions at customary densities. Thus, in the known configurations for a dual band linear focal plane array the IR opaque MWIR-MUX must be translated out of the optical image beam as it passes to an underlying linear LWIR array and MUX.

When a dual band focal plane array is a staring area detector array, the artifice of translating the MWIR-MUX out of the way of an optical input to a single line of pixels, customary in line arrays, will not work. Directly overlaying a LWIR area detector array and MUX, with a PV MWIR area detector array and MUX, to form a dual band, staring, area detector array will fail because the PV MWIR area array and the MUX may be expected to block the LWIR optical input to the LWIR area detector array.

In another development, new detector device research has been directed to development of monolithic, time-switched photovoltaic diode (PV) structures. In this case the staring detector array is electrically switched to respond to one of the two (MWIR or LWIR) spectral bands. This approach lacks the desirable feature of providing simultaneous response to both bands.

In copending application Ser. No. 07/832,799 of Milton Noble, a focal plane for dual band IR sensing of a two dimensional image is described, the arrangement providing coincident simultaneous images. In that arrangement, a four chip arrangement is described in which a mid wave array indium bumped to its MUX, is mechanically aligned to a LWIR array and MUX with a small gap. The first chip is a MWIR MUX with an apertured layout having transparent windows, permitting IR illumination of the pixels of an underlying MWIR detector array formed on a second chip. The MWIR detector array is of the Metal Insulator Semiconductor (MIS) Charge Injection Device (CID) variety, in which the pixels can be transparent to lower energy long wave IR. The third chip is a backside illuminated LWIR PV diode array, which is connected to a fourth chip containing an opaque LWIR MUX on the optical axis but beyond all optical paths, which are suitable locations for the PV diode detector array and the LWIR MUX.

SUMMARY OF THE INVENTION

Accordingly it is an object of the present invention to provide an improved sensor in which simultaneous, superimposed, two-dimensional images in two IR bands are read out.

It is another object of the invention to provide a sensor producing simultaneous, superimposed, two-dimensional images in two IR bands and having a simplified structure.

It is a further object of the invention to provide a sensor producing simultaneous, superimposed, two-dimensional images in two IR bands, in which pixel level accuracy in registering the two images is facilitated.

It is still another object of the invention to provide a sensor producing simultaneous, superimposed, two-dimensional images in two IR bands in which the dual band detector arrays are monolithically integrated upon a common substrate.

It is a further object of the invention to provide a novel integrated circuit in which two IR sensing area detector arrays for producing simultaneous, superimposed, two-dimensional images in two IR bands are monolithically integrated upon a common substrate.

These and other objects of the invention are achieved in a novel combination in which pixel-registered, two-dimensional, medium wave and long wave IR (MWIR, LWIR) images are simultaneously readout in an IR sensor.

The novel sensor comprises means for forming two-dimensional images of a MWIR and LWIR emitting object field upon a focal plane and the focal plane per se.

The focal plane comprises a front-side illuminated, two-dimensional, medium wave IR (MWIR) sensitive array, monolithically integrated, on a common substrate with a back side illuminated two-dimensional long wave IR (LWIR) sensitive array. The MWIR detector array uses MIS CID pixels, each pixel comprising a single-gate capacitive element with the accumulated charge representing the integrated light intensity at the pixel. The IR sensitive region of each pixel has a transparent sense gate allowing it to form an IR transmissive window for the underlying LWIR detector array with the necessary opaque conductors and contacts to individual pixels being distributed within the image boundary in aisle-like regions framing the IR transmissive windows.

The back side illuminated LWIR detector array utilizes LWIR sensitive photo-voltaic (PV) diode pixels in which the instantaneous current in each pixel requires amplification prior to further processing.

The LWIR detector array is disposed on the back side of the common substrate, behind the MWIR detector array, with the two detector arrays being coextensive and the LWIR pixels being aligned with the pixel windows of the MWIR array. This insures pixel-registration of the same image between MWIR and LWIR arrays.

The focal plane further comprises a MWIR multiplexer (MUX) including switch, preamplifier, multiplexer, and shift register portions, disposed on an IR transparent silicon substrate behind the imaging means and in front of the substrate containing the MWIR and LWIR detector arrays and in registry with their respective pixels. The MWIR MUX is an integrated circuit (IC) laid out so that the IR opaque parts of the switch portion are apertured and lie in aisles around each "window" to provide image paths to each pixel of the MWIR and LWIR arrays. The preamplifier, multiplexer, and shift register portions of the MWIR MUX are then placed outside of the image boundary. Opaque conductive interconnections between the individual pixels of the MWIR detector array and MWIR MUX for image readout, which must lie within the image boundary, are aligned with the aisles to minimize interception of IR image illumination. The MWIR MUX is indium bumped to the MWIR detector array.

Thus the MWIR MUX avoids blocking IR radiation imaged on the IR sensitive regions of MWIR and LWIR detector arrays, and both MWIR and LWIR radiation will pass through the windows of the MWIR MUX to the MWIR and LWIR detector arrays. The MWIR detector array and MWIR MUX with their IR transparent windows allow the LWIR focused radiation to pass on to the LWIR detector array.

Further in accordance with the invention, the substrate on which the MWIR and LWIR detector arrays are formed is of LWIR transmissive CdZnTe having a (111)B face oriented for front side illumination and the (111)A face oriented for back side illumination. The MWIR MIS-CID detector array is formed on the front face of the substrate in an n-type mercury cadmium telluride (MCT) layer grown on the (111)B face of the substrate. The n-type MCT layer has a band gap suitable for MWIR sensing and absorption, and is nonresponsive to and transparent to LWIR. The gates of the MWIR detector array, which are formed on an insulating layer grown on the n-type MCT layer, are of an IR transparent metal patterned to form a two-dimensional array of IR transmissive window shaped pixels with the IR opaque metallic connections to individual pixels lying principally in aisles framing the windows.

The two-dimensional LWIR sensitive photovoltaic (PV) diode detector array is formed in a p-type MCT layer grown on the back (111)A face of the CdZnTe substrate. The p-type MCT layer has a band gap suitable for LWIR sensing with patterned n-type diffused regions and patterned contacts to these regions providing an array of LWIR sensitive PV diode pixels. The LWIR pixels are aligned with the LWIR transmissive windows to intercept the LWIR illumination passing through the MWIR MUX and the MWIR detector array to achieve pixel-registration between the two detector arrays.

Readout of the LWIR detector array is achieved by a LWIR (MUX) formed on a third silicon substrate, mechanically attached on the back face of the LWIR sensitive array so as to be beyond the optical paths. The LWIR MUX contains a preamplifier electrically connected to each PV diode pixel for amplifying the weak signal to a level suitable for further processing in the LWIR MUX. The LWIR MUX is attached to the back side of the LWIR detector array by indium bumps.

In accordance with a further aspect of the invention the n-type (MCT) layer on the front (111)B face of the CdZnTe substrate is a molecular beam epitaxial (MBE) layer and the p-type MCT layer on the back (111)A face of said CdZnTe substrate is a liquid phase epitaxial (LPE) layer.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

FIG. 6 is a timing diagram descriptive of the operation of the MWIR detector array and MWIR MUX in performing readout of a two-dimensional image.

DESCRIPTION OF THE PREFERRED EMBODIMENT

Figure 1:
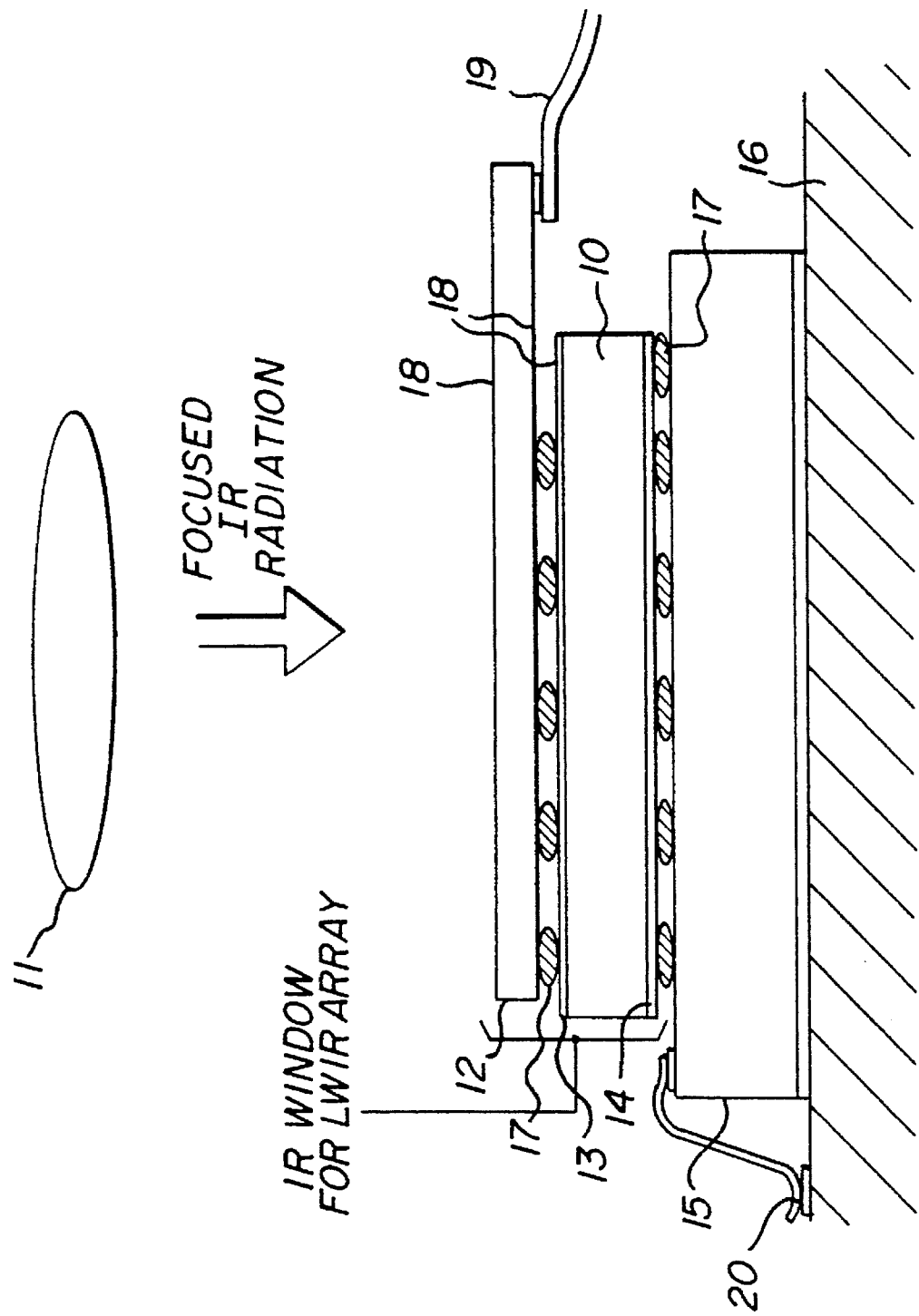
FIG. 1 is a simplified cross-sectional view of a novel dual band IR sensor for a staring detector array formed in a three chip stack in which pixel-registered, two-dimensional medium wave and long wave IR (MWIR, LWIR) images are formed, the illustration showing the installation of the sensor into an IR camera system.

A cross sectional view of a novel dual band IR sensor for a staring array in which pixel-registered, two-dimensional MWIR and LWIR images are simultaneously read out, is shown in FIG. 1.

The dual band IR sensor is a part of an IR camera or sensor system having a conventional objective lens and conventional means for cryogenic operation. The objective lens 11 images medium wave and long wave IR radiation emitted by the object field upon a novel dual band IR sensor containing two IR sensitive detector arrays monolithically integrated on a single substrate, and coaxially disposed at the focal plane of the lens. The objective lens should be of a suitably long focal length, of appropriate aperture, and suitably corrected at the respective wavelengths so that both the medium wave and long wave detector arrays, which are in slightly displaced planes, are exposed to properly focussed IR images. Cryogenic operation is provided by a cold finger used to cool the arrays. The cold finger acts through a supporting "hybrid" substrate 16. A dewar and cold shield, which are not illustrated, together with the cold finger maintain the arrays at the low temperature (65K to 78K) necessary for operation in the presence of the usual higher ambient (300K) unfocused background temperatures.

The dual band sensor is an assembly of three monolithically integrated circuits (12, 10, 15) or "chips" arranged in a stack and precisely aligned along a common axis to insure pixel to pixel registration. The MWIR and the LWIR detector arrays are monolithically integrated on the front side and back side respectively of an IR transparent CdZnTe substrate, at the center of the three member stack. Monolithic construction of the two detector arrays on the common substrate 10 provides accurate, and permanent, pixel to pixel registration between them. IR transparency of the substrate 10 permits the LWIR illumination exiting the MWIR detector array to pass on to the LWIR detector array. The MWIR MUX integrated circuit of FIG. 1 (using a convention in which the objective lens 11 is in "front" and the hybrid 16 is in "back"), intercepts all IR image radiation directed toward the MWIR and LWIR detector arrays.

The MWIR MUX is formed on an IR transparent silicon substrate. The layout of the IR opaque circuitry of the MWIR MUX is apertured to create IR transparent windows for the passage of IR illumination to individual pixels of the MWIR and LWIR detector arrays. The back side of the MWIR MUX is assembled to the MWIR detector array by indium bumps 17 which connect the gate contacts of the MWIR detector array to the MUX for readout. The MWIR MUX 12 and the MWIR detector array 13, which is an IR sensitive array of the MIS CID kind, together convert the incident two-dimensional MWIR image to a sequential electrical video output signal available at tape cable 19.

The LWIR detector array 14, which is a PV diode array, is electrically connected by Indium bumps 17 to a LWIR MUX at the back of the three member stack which in combination with an epoxy back-fill interface also provides mechanical and thermal bonding. The same bonding, except no epoxy at the MWIR array/MUX and no indium bumps at the LWIR MUX/hybrid substrate, attaches all three ICs to the hybrid substrate 16. The LWIR MUX 15, which must make contact with each pixel of the LWIR detector array 14 is beyond the optical paths of the IR images and thus does not require an apertured layout but may fully occupy the area within the image boundary. The LWIR video output is available via flying leads at the pads 20.

As shown in FIG. 1, the focused (MWIR and LWIR) radiation is incident first on the MWIR MUX 12, formed on an IR transparent silicon substrate. Radiation from both IR bands must pass through the MWIR MUX 12, and illuminate the MWIR and LWIR detector arrays 13, 14 formed on the CdZnTe substrate 10 behind the MWIR MUX. The front and back surfaces of the MWIR MUX chip and the front surface of CdZnTe chip 10 are provided with dual band IR anti-reflective coatings to enhance optical performance. LWIR radiation is allowed to pass through the MWIR detector array which is designed not to absorb LWIR radiation, and through the CdZnTe substrate 10 per se, to illuminate the LWIR detector array on the back side of the substrate. The LWIR MUX 15, which is behind the LWIR detector array 14 and formed on the third IC, is behind the other two ICs and beyond the optical paths as noted earlier.

Figure 2:
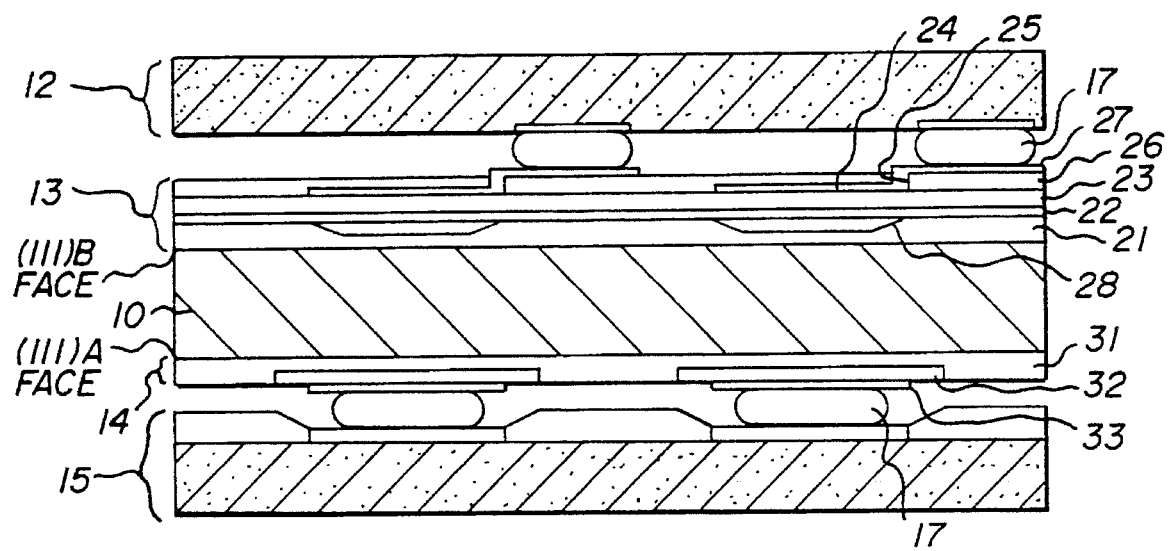
FIG. 2 is a second cross-sectional view of the dual band IR sensor, detailing the internal structures of and connections to a MWIR sensitive MIS-CID detector array and a LWIR sensitive PV diode detector array monolithically integrated on the front side and back side respectively of a common CdZnTe substrate and forming the central member of the three chip stack.

The physical structure of the MWIR and LWIR detector arrays 13, 14, which are monolithically integrated on the CdZnTe substrate 10, is best seen in FIG. 2. The front to back orientation in FIG. 1 is retained in FIG. 2, with the substrate for the MWIR MUX 12 being in "front", the substrate 10 bearing the two detector arrays being in the middle, and substrate for the LWIR MUX 15 being in "back" of the three chip assembly. The indium bumps 17, which interconnect the three ICs electrically and provide for their mechanical assembly into a hybrid structure, are also shown in FIG. 2.

The front side illuminated MWIR MIS CID detector array is formed on the (111)B face of the CdZnTe substrate 10, as shown in FIG. 2. The CdZnTe substrate is a nominal 10–20 mils (0.254–0.508 cm) in thickness, the thickness being selected to achieve the necessary robustness to maintain the integrity of the MWIR, LWIR detector arrays formed thereon and to permit their attachment by means of the indium bumps 17 to the MUXes 12 and 15. The CdZnTe substrate 10 is substantially transparent to LWIR image radiation which must reach the underlying LWIR array, and thus the thickness is set primarily by mechanical and other considerations. The 10–20 mil (0.254–0.508 cm) CdZnTe substrate is available commercially, and is available with a (111) crystalographic orientation.

As shown in FIG. 2, the MWIR detector array 13 is formed in an (n-type) mercury cadmium telluride (MCT) layer 21 grown on the (111)B front face of the CdZnTe substrate 10. The n-type MCT layer is a molecular beam epitaxial (MBE) layer, which replicates the (111)B crystalline structure of the CdZnTe substrate. The MBE process is carried on at relatively low temperature (~200° C.) and does not disturb the LWIR detector array structures on the back face of the substrate 10, which are liquid phase epitaxial (LPE) layers, formed earlier in the processing at much higher temperatures. The (111)B face of the CdZnTe substrate is the preferred face for MBE deposition of MCT, allowing the LPE layer for the LWIR detector array be grown on the (111)A face, which is the preferred face for LPE growth of MCT.

The MBE/MCT layer 21 is a homogeneous n-type layer. The composition of the layer determines the wavelength of radiation that will be detected by devices subsequently fabricated in the material. The composition of the MCT layer can be adjusted to match the intended application by appropriate control of the MBE source ovens. In this case, the composition of the MBE layer is tailored to provide sensitivity to wavelengths shorter than 5 microns. This insures that the n-type layer is non-responsive to and non-absorptive of the lower energy LWIR radiation. The n-type carrier concentration of the layer is typically about $10^{15}$ cm$^{-3}$. This can be adjusted by introducing extrinsic dopants during layer growth, or by annealing the layer under a controlled Hg overpressure after MBE growth.

Figure 4:
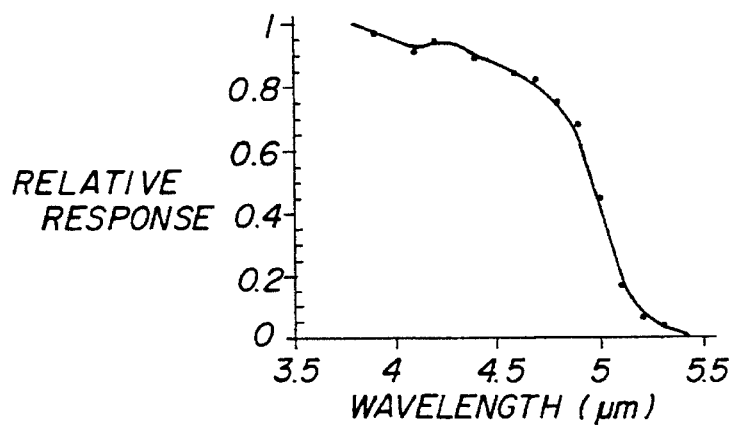
FIG. 4 is an experimentally measured spectral response curve of the MWIR detector array to IR radiation, showing operation from 3.75 microns to cut-off at 5 microns, corresponding to the "medium" wavelength infrared band.

The n-type MCT layer has a nominal thickness of 10 microns, which together with the proper carrier concentration, is selected to insure absorption of a high percentage of the incident MWIR photons for efficient MWIR sensitivity and insensitivity to LWIR photons. Efficient MWIR photon capture also insures minimum leakage of MWIR photons to the LWIR array, where they would reduce the spectral separation of the MWIR and LWIR images. The spectral response of a suitable MBE/MCT layer designed for MWIR operation is illustrated in FIG. 4.

The mechanism for sensing the MWIR radiation in the n-type MCT layer 21, is the metal insulator semiconductor structure which is patterned to collect charges created by MWIR photons entering the MCT layer, storing these charges in the effective capacitor formed between the gate and substrate at each pixel site. The charges are then periodically sensed by the MWIR MUX, which also discharges the capacitors by the charge injection device readout process. The CID readout process will be discussed in greater detail in relation to FIGS. 5 and 6.

Figure 3:
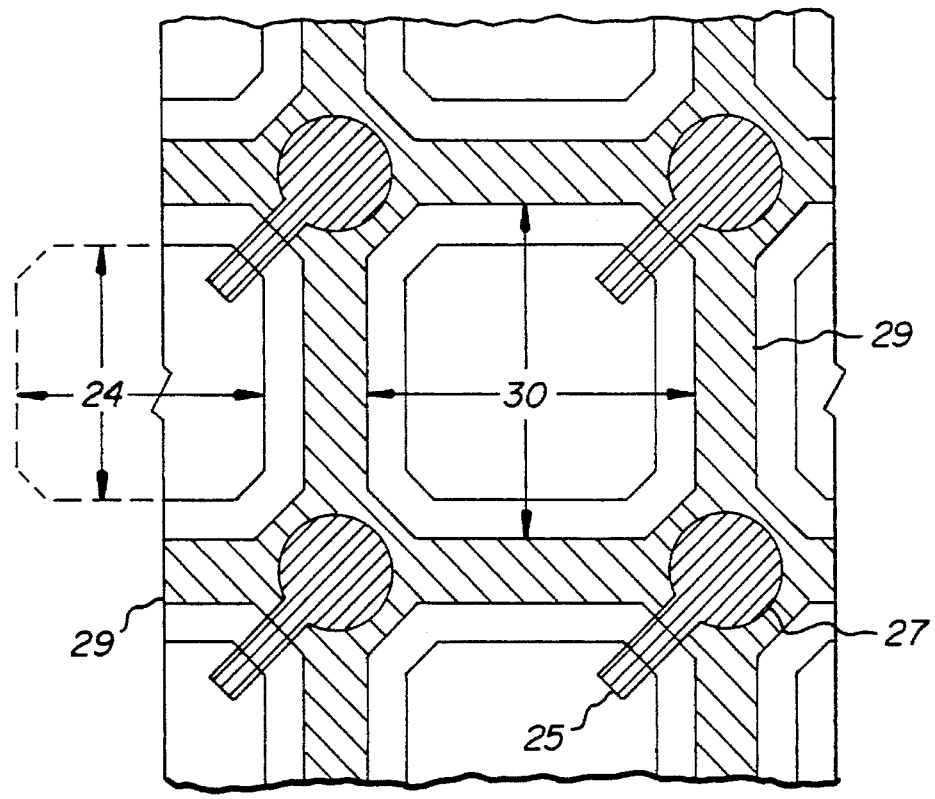
FIG. 3 is a plan view of the MWIR detector array illustrating the arrangement of the IR sensitive region or sense gate of a typical pixel, which also forms an LWIR transmissive window to the LWIR detector array, and the distribution of IR opaque conductors principally within aisles bounding each window within the pixel area.

Pixels of the MIS structure of the MWIR detector array are illustrated in section in FIG. 2 and in plan view in FIG. 3. The "Metal" plate of the MIS capacitor for each pixel is a thin semi-transparent layer 24, for example chromium which is deposited upon the "Insulator", itself a composite layer formed of two layers 22, 23. Suitable materials for the insulator are an anodic oxide 22, which is grown on the n-type MCT, i.e., the "Semiconductor", to a thickness of from 500 to 1000Å and a ZnS layer 23, which is grown on layer 22 to a thickness of from 6000 to 8000Å. A total insulation thickness of 7000–8000Å is desirable to achieve a suitable dielectric strength. FIG. 3 shows the transparent metal plate or sense gate 24 of a pixel in a plan view. Carriers will be created by incident photons in the region of the n-type MCT layer under the sense gate and then the carrier will be captured by the gate. The sense gate thus determines the IR sensitive area of each pixel of the MWIR array. The IR sensitive area of each pixel is shown in cross-section in FIG. 2 at 28. The region 28 is the MIS depletion well, which is created when gate potential is applied and in which carriers created by incident photons are captured.

As shown in FIG. 3, the IR sensitive area of each pixel is approximately square and is surrounded by an IR opaque field shield 29 (not shown in FIG. 2). Electrical connection to the semi-transparent sense gate 24 is by short gate contacts 25 passing upward through a passivating/insulating layer 26 and connected to the indium bump pad metallization 27. The indium bumps 17 used to connect the MWIR array to the MWIR MUX are then bonded to the bump pads 27. The conductors 24, 25 and 27 are thus connected together and insulated from the field shield 29, which is returned to the ground of substrate 10.

The IR opaque field shield 29, which extends throughout the imaging area has an apertured layout in which it is confined to aisles framing the IR transmissive windows 30 defined by the sense gate 24. The perforation in the passivating/insulating layer for the gate contact 25 lies at the upper right-hand corner of each sense gate (using the orientations of FIG. 3) near an aisle intersection. The gate contact 25 and a narrow finger of the bump pad metallization 27 are the only opaque conductors extending over the IR transmissive window 30. The gate contact is kept small and placed near a corner of the window so that the finger of metallization 27 may be both short and narrow where it passes over the window to minimize the reduction in sensitive area of the pixel. The bump pad metallization 27, upon leaving the window area, enters the aisles framing the window where the dimensions may be increased to aisle width without radiation loss. The pad portion of metallization 27, to which the indium bumps 17 are bonded lies at the aisle intersections. Both the widened bump pad portion and the bumps 17 per se are restricted to the area provided in aisles bounding each pixel window.

The sensor including the MWIR detector array and MWIR MUX may be fabricated at a typical 2 mil pitch with a fill factor of approximately 25% or more. The fill factor is set by the opaque circuitry on both the MWIR detector array chip and on the MWIR MUX chip which is associated with individual pixels of the MWIR detector array. The pixel associated opaque circuitry of the MWIR MUX 12, which must overlie the pixel area, is laid out in orthogonal sets of aisles creating IR transparent windows aligned with the aisles and windows of the MWIR detector array.

The MWIR MUX 12, which is in front of the MWIR detector array 13, thus must use an apertured layout dimensioned to minimize the reduction in sensing area of the pixels of the MWIR and LWIR arrays. The MWIR MUX 12 consists of four principal portions; a switch portion, a preamplifier portion, a shift register, and a multiplexer portion all shown in FIG. 5. The switch portion consists of plural cells 56 of active circuits which must be connected individually to each pixel of the MWIR array, and in being proximate to each associated pixel must lie within the image boundary. (The image boundary is set by the boundary to the rows and columns of pixels.) Thus the switch portion, each cell of which consists of three switches (SR, SS, SC) associated with one pixel, must be distributed over the area within the image boundary. To minimize the loss in sensitive area available for each pixel of the MWIR array, the aisles in which the opaque regions of the switch portion of the MWIR MUX lie, must be optically aligned with the aisles around each pixel window of the MWIR array, and the aisles should be as narrow as is practical, consistent with the space requirements of the opaque conductors essential to the readout process. Such an apertured layout brings the windows in the MWIR MUX and MWIR array into coincidence, and maximizes the area of each pixel.

The other portions of the MWIR MUX (preamplifiers, shift register, and multiplexer) need not lie within the image boundaries. The connections between these other portions of the MUX need not be individualized, but may take the form of common connections or buses, the opaque conductor runs of which are connected to the MWIR array via the bumps 17, and which serve to connect the pixels together in rows and in columns. The opaque bus conductors connect the pixels to the "other portions of the MUX", permitting these "other portions" to be displaced outside the image boundary. Thus, while the buses for the preamplifiers, shift register, and multiplexer portions of the MUX 12 must be laid out in aisles aligned with the aisles established on the MWIR array 13, the preamplifiers, shift register and multiplexers per se may be conveniently layed out outside of the image boundary.

The apertured layout of the switch portion of the MWIR MUX in which opaque conductors are restricted to orthogonal aisles is designed to provide maximum area MWIR transmissive windows for individual pixels of the MWIR detector array behind it, and to provide maximum area LWIR transmissive windows for pixels of the LWIR detector array 14 behind the MWIR detector array. The fill-factor for the MWIR band, preferably as large as possible, is thus set by the layout of sets of opaque conductors on both ICs and is maximized when the two sets are optically coincident and permit coincident windows of maximum area. Additionally, the optically sensitive areas of the pixels of the LWIR array 14, arranged behind the other two, must be properly dimensioned and aligned with these windows in order to maximize the fill-factor at the LWIR array.

A suitable MWIR MUX 12 is a monolithically integrated, complementary metal oxide semiconductor design (CMOS), fabricated upon a silicon substrate. The simplified electrical circuit of the MWIR MUX is provided in FIG. 5 with the cell layout of the switch portion of the MUX for a small set of pixels being provided in FIG. 7. The windows 51 (FIG. 7) in the switch-portion of the MUX are IR transparent for transmission of both MWIR and LWIR spectral bands. When the MWIR MUX 12 and MWIR detector array 13 are indium-bumped together, the windows 51 of the MWIR MUX (FIG. 7) are aligned with the windows 30 (FIG. 4) of the MWIR detector array. The indium bump connecting the MWIR MUX and the MWIR detector array at each pixel site is located at an aisle intersection. On the MWIR MUX, the indium-bumps 17 are bonded to indium bump pads 54, formed over a dielectric layer arranged over and insulated from the underlying conductor runs (FIGS. 5 and 7).

Figure 7:
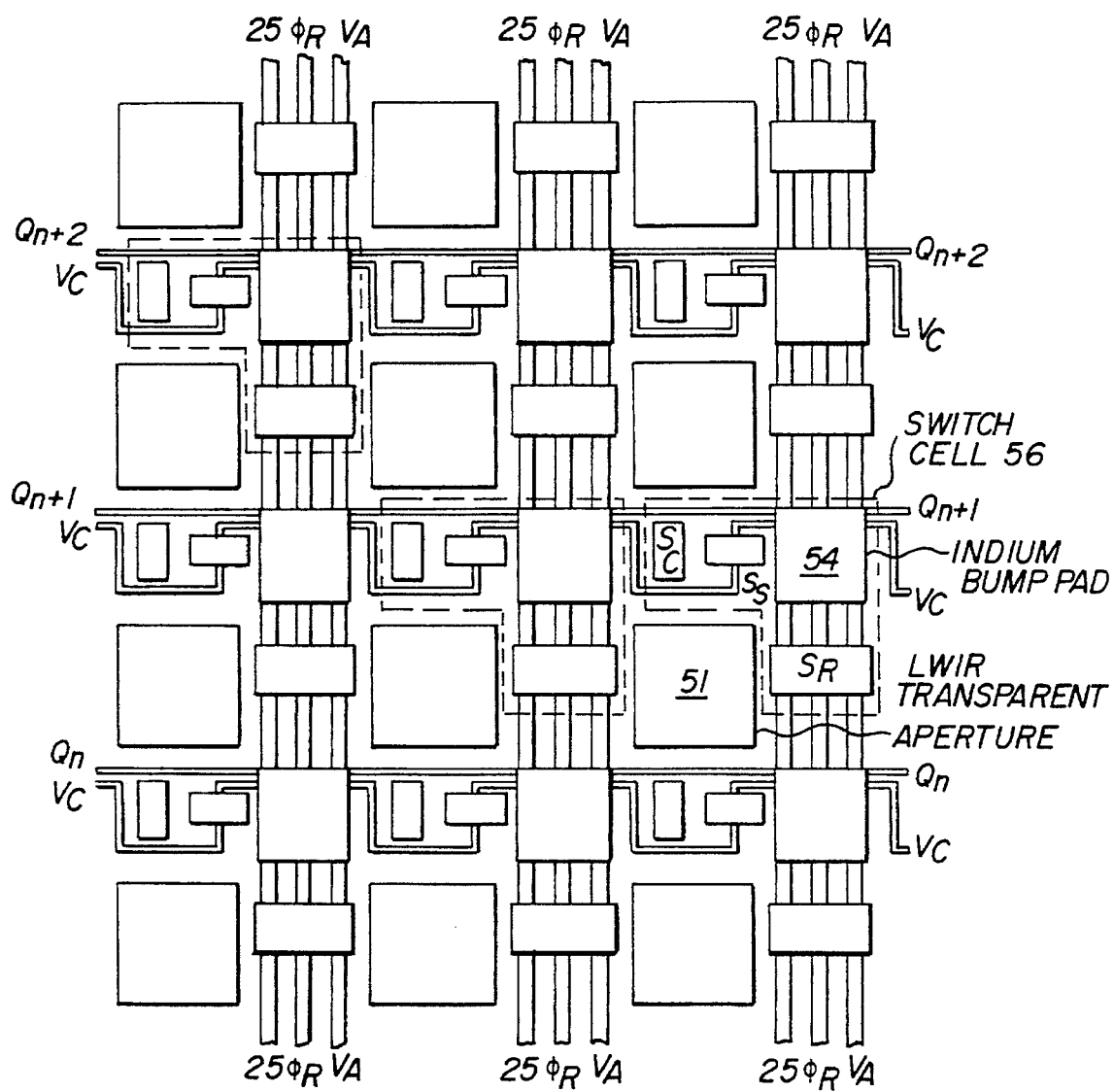
FIG. 7 is a plan view of the layout of the switch portion of the MWIR MUX formed on an IR transparent substrate of the front chip, with opaque circuit portions and contacts being laid out with IR transparent apertures to allow passage of the MWIR and LWIR images to the IR sensitive regions of the pixels of the respective detector arrays with minimum loss.

The layout of the MWIR MUX is illustrated in FIG. 7, with successive rows of pixels being spaced along horizontal lines and successive columns of pixels being spaced along vertical lines of the illustration. The MWIR and LWIR transparent apertures 51 ("windows") of the MWIR MUX (FIG. 7) are spaced horizontally and vertically at a nominal two mil interval and are approximately square with one mil sides. The windows 51 are the largest recurrent feature of the MWIR MUX layout. An indium bump pad 54 significantly smaller than the apertures 51, is formed over the busses passing through the intersection. The busses $V_A$, $\phi_r$, and 25 pass under the pads 54 in vertically oriented paths while the busses $Q_n$ and $V_C$ pass under the pads 54 in horizontally oriented paths. The three FET switches $S_R$, $S_S$ and $S_C$, which are all quite small, are associated with each pixel site and cluster about each pad 54. The FET switch $S_R$ is immediately below pad 54, and FET switches $S_S$ and $S_C$ are to the left of the pad 54.

The three FET switches $S_R$, $S_C$, and $S_S$ and the bump pad 54 of the MWIR MUX associated with a pixel site of the MWIR detector array form an inverted "L" shaped figure, with the associated transparent window 54 being placed in the corner of the L. The orientation of the switches and bump pad with respect to the transparent window then correspond with the layout of aisles and bump pads with respect to the windows of the MWIR detector array as seen in FIG. 3. The indium bump pad 27 on the MWIR detector array, is above and to the right of the sense-gate 24 of the associated pixel, so that the latter will be in correct alignment with the corresponding window of the MWIR MUX when the bump pad 27 is bumped to the bump pad 54.

Figure 5:
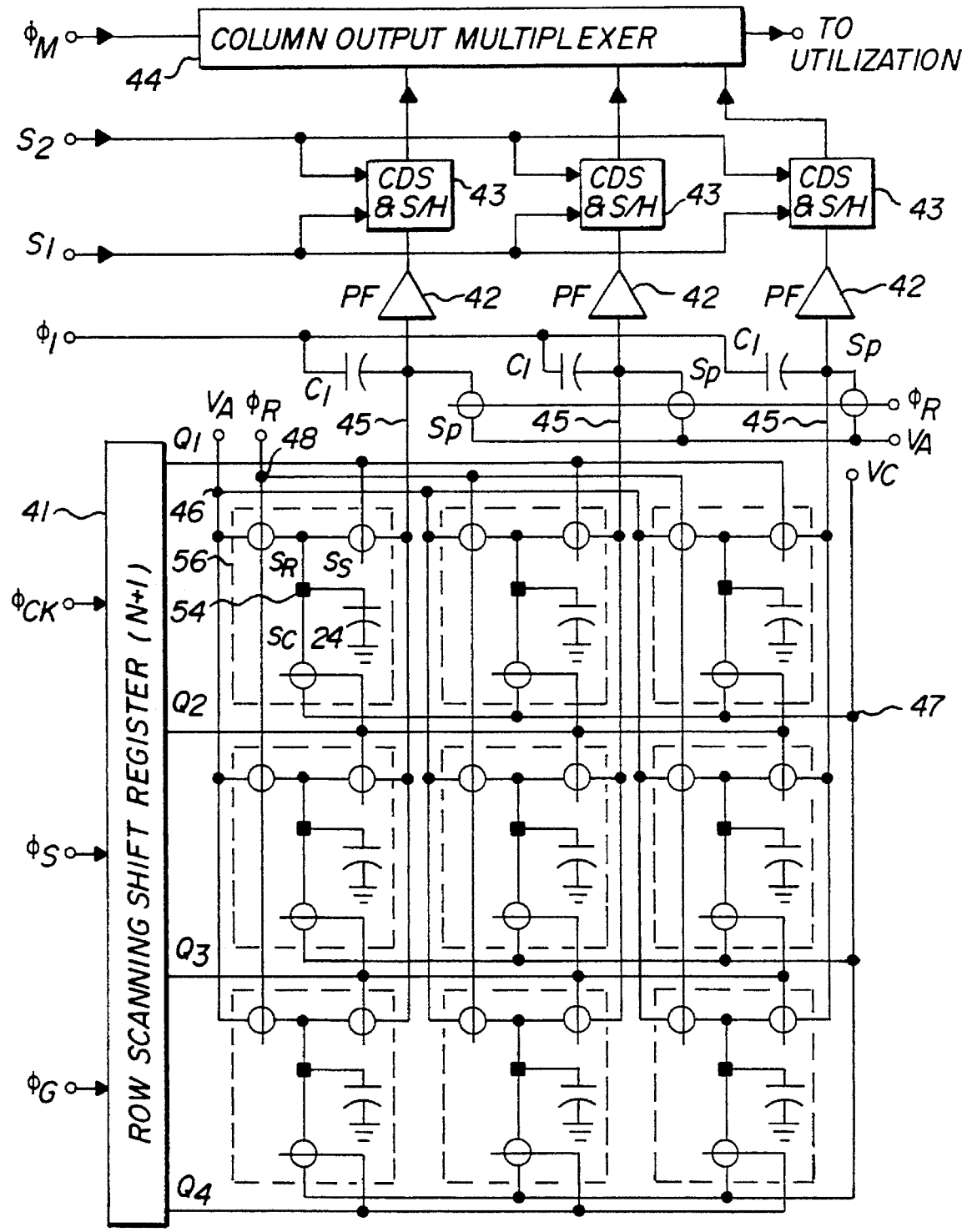
FIG. 5 is an electrical circuit diagram illustrating the pixel sense gates of the MWIR detector array on the central chip and the MWIR MUX (switch, preamplifier, shift register and multiplexer) forming the front chip of the three chip stack and through which the MWIR and LWIR images must pass, and the connections between the MWIR detector array and MWIR MUX to enable readout of the two-dimensional MWIR image.

As shown in FIG. 5, the switch portion of the MUX consists of all the cells 56, each containing three switches ($S_R$, $S_S$, and $S_C$) associated with each pixel site, and whose function is to connect the sense-gate 24 (FIG. 3) of the MWIR detector array to the readout portion of MWIR MUX with appropriate timing. These connections permit the periodic readout of the integrated light intensity at each pixel.

The circuitry for the MWIR MUX and the waveforms controlling its operation are best understood by reference to FIGS. 5 and 6, respectively. The MWIR MUX includes a row scanning shift register 41, row ($Q_1$–$Q_n$) and column (45) busses, each connected to the input of a separate parallel preamplifier/filter 42 and correlated double sample (CDS) and sample/hold circuit (S/H) 43; and a column output multiplexer 44. As noted earlier, the readout portion of the MUX except for the busses, is located outside the image boundary. The elements 41–44 are connected to the individual CID sense-gates 24 by means of the switches (SR, SS and SC) of the switching portion of the MUX and two orthogonal sets of buses.

For a 128×128 element MWIR detector array, each pixel in a given ($n^{th}$) row of the 128 rows is selectively connected by the three associated switches to two row busses ($Q_n$, $Q_{n+1}$). In addition, each pixel in a given column, is selectively connected to its preamp column bus 45, of which there are 128. Row and column busses 46, 47, and 48 selectively connect all pixels to the reset bias voltage $V_A$ (bus 46), the clear voltage $V_C$ (bus 47), and the reset clock $\phi_R$ (bus 48). At each pixel a reset FET-switch $S_R$, controlled by the $\phi_R$ reset bus, connects all pixels to the reset voltage $V_A$. Row select FET-switches $S_S$, controlled by the row scanning register 41, connect individual pixel sense-gates (24) to their associated vertical preamp buses 45. A clear FET-switch $S_C$ is controlled by the succeeding row (on the row scanning register) to connect the previous pixel sense-gates to the reset bias voltage $V_C$, which places the pixel in a condition to initiate the next integration time.

The column output multiplexer 44 takes sequential temporal samples of the output of each column sample/hold circuit (part of 43) to provide a waveform of contiguous analog samples on each row of pixels, from pixel 1 to pixel 128. Each row of pixels is read out in secession from row 1 to row 128, and then the process is repeated for each successive frame to form successive two dimensional images.

The row scanning shift register 41 sends gating signals to the switch portion of the MWIR MUX to connect the selected row of pixels to the output preamps in sequence until all rows have been sampled. The shift register 41, is controlled by three principal control signals $\phi_S$, $\phi_{ck}$ and $\phi_G$, the last control signal being shown in FIG. 6. The control signal $\phi_S$ is the frame start pulse that initiates row reading at row 1. The clock waveform $\phi_{ck}$ controls the timing of the multiplexer, and in combination with the row scanner drive pulse waveform $\phi_G$ initiates the scanning of each row. When $\phi_G$ is high, the selected row gates of $S_S$ in the switch portion of the MUX connects each CID sense-gate to its associated preamp bus.

Just prior to connection of the CID sense gates to the preamp buses, the reset pulse waveform $\phi_R$ is applied to all CID sense gates connecting them for a short time to $V_A$, the reset bias voltage. The reset waveform $\phi_R$ and bias voltage $V_A$ also simultaneously reference all preamp buses 45 by means of the FET-switch $S_p$ to the reset bus voltage $V_A$. Reset of the preamp buses takes place before each row of pixels is connected to the preamp inputs.

Readout of the CID sense gates (pixels) is accomplished by taking the difference between the CID gate voltage before and after the CID gates are injected, which dumps the integrated charge into the substrate.

Consequently, once row N is selected by the row select waveform $Q_N$ there are three gating waveforms used to perform the CID gate readout. First, waveform $S_1$ causes a sample of the CID pixel gate voltage to be stored on a sample/hold capacitor in block 43. The next waveform $\phi_I$, (the injection pulse) is applied to all CID sense gates on the selected row and lastly pulse waveform $S_2$ causes the correlated double sample (CDS) circuit in block 43 to take the second sample, following the injection process. At this time the output of the CDS and S/H circuits 43 are proportional to the difference in CID gate voltages before/after injection. This difference voltage, which block 43 obtains, is proportional to the optical flux integrated by each pixel over the last integration time period, $T_i$.

The column output multiplexer 44 derives its input by sampling the outputs of the 128 CDS and S/H circuits 43 and creates an output sequence of column 1 to column 128 which is a readout of the signal on pixel 1 through 128 for the selected row $Q_N$.

A "read and clear" function is performed as each successive new row is selected. As row $Q_N$ is read, then the prior row $Q_{N-1}$ will be "cleared", i.e. all pixels in that row will be reset to a "clear" reference voltage $V_C$. This references all pixels in each row to a common voltage prior to the next integration time. Thus, the actual IR detector array integration time will be the time to read (N–1) rows.

The LWIR detector array 14 and the LWIR MUX 15, are arranged beneath the MWIR MUX 12 and MWIR detector array 13 as already noted. Precise pixel to pixel registration between all four members 12–15 is essential. The four elements 12, 13, 14 and 15, are of equal pixel counts (e.g. 128 by 128) and of equal pitch (e.g. 2 mils (50.8 microns)).

The LWIR detector array 14 and LWIR MUX 15 are of a conventional design available from several sources. The LWIR detector array 14 is a PV diode array formed in the mercury cadmium telluride (MCT) layer 31 grown on the backside (111)A face of the CdZnTe substrate 10. The LWIR detector array 14 is thus "back side" illuminated with the active detector sites being indium bumped at each pixel site to the LWIR MUX 15 placed behind the LWIR detector array. The LWIR MUX 15 is of silicon, typically of a CMOS process. Since no IR need pass through the LWIR MUX, it may be laid out in a less restrictive pattern than the MWIR MUX, filling the area within the LWIR image boundary as needed. The LWIR detector array 14 and LWIR MUX 15 are bonded to the hybrid 16, which provides electrical connection and mechanical support for both the MWIR and LWIR elements, and a thermally conductive path for cooling both detector arrays, as earlier stated.

The PV diodes of the LWIR array are formed in the p-type MCT layer 31 with localized n-type diffusions forming photovoltaic (PV) diodes in which carriers are created in response to incident LWIR photons. The p-type MCT layer 31 is formed on the (111)A face of the CdZnTe substrate by a Liquid Phase Epitaxial (LPE) process which initially produces an n-type layer. A "p-anneal" is carried out to remove mercury and to convert the layer to p-type with a carrier concentration of approximately $10^{17}$ cm$^{-3}$. The band gap of the LPE layer is determined by the composition of the liquid melt from which it is grown and is optimized for LWIR absorption. The p-layer is then passivated and masked to create openings which define pixel locations. A second anneal diffuses mercury into the pixel regions to create isolated n-type regions 32 within the p-type layer 31 to form n-on-p photovoltaic diodes with the n-type layer having a carrier concentration of approximately $10^{15}$ cm$^{-3}$. The localized n-regions are then provided with ohmic contacts 33, to complete the PV diodes.

The electrical output of each PV diode is in the form of a continuous current, instantaneously proportional to the incident flux. The PV diode current is very small and requires immediate electrical amplification.

The LWIR MUX 17, which is indium bumped to the LWIR array 14, thus must provide amplification at each pixel site prior to multiplexing the individual pixel signals into a single video signal. The consequence of this requirement is that the LWIR MUX does not readily lend itself to a layout in which IR transparent apertures are provided at each pixel site. Thus the LWIR MUX 17 is placed at the back of the three chip stack beyond the radiation paths.

Fabrication of the monolithic MWIR and LWIR detector arrays begins with the application of the LWIR Liquid Phase Epitaxy (LPE) layer of MCT to the A-face of a commercially available (111) oriented CdZnTe wafer. The LWIR LPE layer must be applied first since LPE is a high temperature process and would severely degrade the MBE applied MWIR layer .if it were applied first. Following deposition, the LWIR LPE layer is annealed under a mercury overpressure at temperatures chosen to yield uniform p-type behavior throughout the LWIR epilayer by the formation of Hg vacancies in the material.

At this point, a protective coating such as $SiO_2$ or ZnS is applied to the LWIR layer so that the opposite side of the substrate can be prepared for the MBE growth of the MWIR layer without damaging the LWIR layer. MBE growth takes place at relatively low temperatures ($\leq 200°$ C.) and does not degrade the LWIR layer. Processing of the LWIR array proceeds with the removal of the protective layer and deposition of a surface passivation layer. A diffusion mask is then applied and photolithographically patterned with openings that define the location of the photo-voltaic elements of the LWIR array. The wafer is then exposed to a second Hg anneal. In this step the temperatures are adjusted so that Hg is driven into the LWIR LPE layer filling the vacancies created by the earlier p-anneal and converting the material back to n-type. Since the diffusion mask is impervious to Hg, this conversion only occurs in the vicinity of the pixel openings in the diffusion mask. The result is isolated n-type regions which define the LWIR detector elements.

Optionally, one may use the second Hg anneal to treat both the LWIR LPE and MWIR MBE layers simultaneously. Following MBE growth, the MWIR layer will typically contain a low concentration of Hg vacancies. It is desirable to fill these vacancies prior to processing the MWIR detectors. While this can be accomplished by a dedicated anneal step, one may utilize the second Hg anneal described above to simultaneously form the p-n junctions in the LWIR layer and fill the Hg vacancies in the MWIR layer. This represents a processing advantage unique to the present structural design.

The diffusion mask is removed following the second Hg anneal processing of the LWIR layer. Dielectric layers are then applied, one of which can also serve as an anti-reflective layer by adjusting the layer thickness on the MWIR side. Processing is completed with the opening of contacts in the dielectric layer and the application and patterning of the metallization.

The processing steps required to complete the MWIR array (described previously) can be interleaved with the LWIR process, or carried out separately after the LWIR array is finished. This flexibility is due to the inherent compatibility between the MWIR and LWIR detector fabrication processes.

In the single-gate CID MWIR array, as shown in FIG. 3, and assuming a fixed pixel pitch, the area of the sense region may be increased at each pixel site to the point allowed by the field shielding (i.e. 29) between adjacent pixels, the gate contacts 25 and the indium bump pads 27. This IR opaque space in the CID detector array 13 then determines the area available for the IR opaque switch portion of the switch-MUX that can be utilized before the fill-factor is further reduced. As noted, the available space for IR opaque circuitry takes the form of the aisles illustrated in FIGS. 4 and 5, framing substantially square window areas. The switch portion of the MWIR switch-MUX is thus distributed in such a way that minimum additional blocking of IR radiation imaged upon the IR sensitive regions of the MWIR array occurs. The three switches for each pixel can be small, very low thermal dissipation devices and, as shown in the simplified showing of the computer generated layout of the IC, the FET switches and circuit runs can easily be fitted into the available space compatible with a 25% fill-factor at a pixel-pitch of 2 mils (i.e. 50 microns). Should a larger pitch be used, the fill-factor can generally be increased, since the shielding, gate contacts and indium bump pads, which set the fill-factor for the MWIR detector array, need not be increased beyond a minimum size.

The use of a CID MIS detector as opposed to a PV detector for the MWIR array in a dual band IR sensor array facilitates an apertured layout in which transparent windows are provided in a MWIR MUX and MWIR detector array for the illumination of the underlying LWIR array. The ability to confine the opaque circuitry of both the MWIR MUX and MWIR detector array within the image boundary to coincident narrow aisles creating clear windows for the underlying LWIR pixels may be attributed primarily to the fact that the CID MIS device is an integrating optical detector, whereas the PV diode device is a non-integrating optical detector. Consequently the switch portion of the readout MUX for the two-dimensional CID MIS detector array may be conveniently partitioned as if the pixels were spatially grouped into a linear array. The three switches at each pixel site are small, take up negligible space, and may be connected by linear busses to the bulk of the opaque MUX circuitry at locations outside the image boundary. A two-dimensional (n×n) CID MIS detector array may thus be readout as if a set of n-parallel linear arrays were formed, each having n pixels with the switches and busses easily confined to narrow aisles within the image boundary.

In contrast to the CID MIS detector, the PV diode device is a non-integrating detector, which, when it is arranged in a two-dimensional array, precludes the CID readout approach in which the pixels can be treated as spatially arranged in linear arrays. This preclusion is because the opaque gain circuitry for reading out each PV device pixel, when it is integrated fills the entire pixel area. Thus due to the required opaque readout circuits in the pixel area, the PV diode device and its MUX are not suitable for use as the front elements in a dual band area array in which the pixels are superimposed.

The selection of a CID MIS MWIR detector array, whose pixels are superimposed over the pixels of a PV diode LWIR array in a single monolithic integrated circuit, thus provides a simple and apparently unique solution to the problem of obtaining superimposed dual band IR images.

The monolithic configuration is readily manufactured. The processing techniques used in forming a monolithic dual band integrated circuit, entailing the high temperature LPE processing techniques to form the LWIR sensitive PV diodes on the back side of a substrate and the low temperature MBE techniques to form the MWIR sensitive CID MIS arrays on the front side of the substrate are both fully compatible, and entail well established semiconductor processing steps.

The novel monolithic structure, in which three rather than four chips are stacked to form a two-dimensional dual band IR sensor simplifies both the mechanical assembly and the optical design. When three rather than four chips are stacked, the alignment error during assembly falls significantly. In three chip assembly, and assuming accurate registration between front and back lithographic features, the operation critical to maximizing pixel areas is precise alignment between the front MWIR MUX chip and the central chip bearing the two arrays. The alignment is set when the two chips are bonded together using the indium bumps. In the four chip configuration, alignment affecting pixel areas requires precision in three bonding steps, a situation which is statistically more severe than when precision is required in a single bonding step.

In the matter of optical design, the three chip arrangement of a two-dimensional sensor allows the MWIR and LWIR arrays to be on the front side and back side respectively of the same substrate, which creates a difference in depth between the arrays of only 10–20 mils (0.254–0.508 cm). In the four chip arrangement the MWIR and LWIR arrays must be formed on mutually remote faces of different chips, doubling the difference in depths, and forcing additional accommodation in the lens design if each array is to be at the optimum focus.

What is claimed is:

1. In a two-dimensional IR staring array in which pixel-registered, medium wave and long wave infrared (MWIR, LWIR) images of the same object field are simultaneously readout, a focal plane assembly comprising:

(A) an LWIR transmissive crystalline first substrate having a first face oriented for front side illumination and a second face oriented for back side illumination, (B) an integrated MWIR radiation sensitive metal insulator semiconductor (MIS) charge injection device (CID) detector array formed on said first face for sensing a two-dimensional image comprising:
(a) a first semiconductor layer of a material suitable for MWIR radiation sensing and absorption epitaxially grown on said first face, and
(b) an insulated gate structure formed on said first semiconductor layer comprising an IR transparent metallic gate layer patterned to form a two dimensional array of IR transmissive window shaped pixels, and IR opaque metallic conductors for connection to individual pixels lying principally in aisles framing said window shaped pixels, said first semiconductor layer and said gate structure forming an array of MWIR sensing MIS-CID pixels distributed within the boundary of said image, each pixel sensing and absorbing MWIR radiation and constituting an LWIR radiation transmissive window,
(c) an integrated multiplexer (MUX) for said MWIR detector array comprising switch, preamplifier, multiplexer, and shift register portions, disposed on the back face of a IR transmissive second substrate disposed in front of said first substrate, the IR opaque parts of said switch portion being apertured and laid out in aisles framing said apertures, said aperture and aisles on said second substrate being in registry with said pixels and aisles on said first substrate; the preamplifier, multiplexer, and shift register portions of said MWIR MUX being displaced outside said image boundary, (C) opaque conductive means aligned with said aisles interconnecting the individual pixels of said MWIR detector array to said MWIR MUX to enable image readout, (D) an integrated two-dimensional, LWIR radiation sensitive, photovoltaic (PV) diode array coextensive with said MWIR detector array comprising a second semiconductor layer epitaxially grown on said second face for monolithic integration with said MWIR detector array, said second semiconductor layer being of a material suitable for LWIR radiation sensing; and a diffusion on the back face of said second semiconductor layer patterned to provide an array of LWIR radiation sensitive PV diode pixels, the LWIR sensitive regions of said LWIR pixels being aligned with said LWIR radiation transmissive windows of said MWIR detector array to provide image radiation to each pixel of said LWIR detector array in registration with the image provided to each pixel of said MWIR detector array, and (E) an integrated LWIR MUX disposed on a third substrate mechanically attached to the back face of said first substrate and electrically connected to individual PV diodes of said LWIR sensitive detector array to enable an LWIR radiation image to be readout simultaneously with and in pixel-registration to the MWIR radiation image.

2. The combination set forth in claim 1 wherein said first substrate is of Cadmium Zinc Telluride (CdZnTe), and said second substrate is of silicon.

3. The combination set forth in claim 2 wherein said first and second semiconductor layers are of mercury cadmium telluride (MCT).

4. The combination set forth in claim 3 wherein said first substrate is of a (111) crystallographic orientation, the (111)B face being said first face and the (111)A face being said second face.

5. The combination set forth in claim 4 wherein said first semiconductor layer is a molecular beam epitaxial (MBE) layer, and said second semiconductor layer is a liquid phase epitaxial (LPE) layer.

6. The combination set forth in claim 5 wherein said first semiconductor layer is n-type having a band gap and thickness selected to optimize MWIR radiation sensing and absorption and be non-responsive to and nonabsorbent of LWIR radiation, to enhance separation of the MWIR and LWIR images at the outputs of the respective MWIR and LWIR MUXes.

7. The combination set forth in claim 6 wherein said second semiconductor layer is p-type having a narrow band gap suitable for absorption and response to LWIR radiation.

8. The combination set forth in claim 7 wherein said first semiconductor layer has electrical properties adjusted to achieve a carrier concentration on the order of $10^{15}$ cm$^{-3}$, and said second semiconductor layer has a mercury vacancy concentration adjusted to achieve a p-region carrier concentration on the order of $10^{17}$ cm$^{-3}$ and an n-region carrier concentration on the order of $10^{15}$ cm$^{-3}$.

9. The combination set forth in claim 8 wherein the front and back faces of said second substrate and the first face of said first substrate are provided with dual band IR anti-reflective coatings.

10. The combination set forth in claim 1 wherein said three substrates are bonded together with indium bumps.

* * * * *